US012770530B2

(12) United States Patent
Kolm

(10) Patent No.: US 12,770,530 B2
(45) **Date of Patent: *Oct. 20, 2026**

(54) APPARATUS AND METHOD FOR MONITORING AND DETECTING FAULT CONDITION

(71) Applicant: John Kolm, Potomac, MD (US)

(72) Inventor: John Kolm, Potomac, MD (US)

( * ) Notice: Subject to any disclaimer, the term of this patent is extended or adjusted under 35 U.S.C. 154(b) by 77 days.

This patent is subject to a terminal disclaimer.

(21) Appl. No.: 19/015,901

(22) Filed: Jan. 10, 2025

(65) Prior Publication Data

US 2026/0204171 A1 Jul. 16, 2026

(51) Int. Cl.

| | |
|---|---|
| ***G09B 9/00*** | (2006.01) |
| ***G06F 30/20*** | (2020.01) |
| *G09B 19/00* | (2006.01) |

(52) U.S. Cl.
CPC ............... *G09B 9/00* (2013.01); *G06F 30/20* (2020.01); *G09B 19/00* (2013.01)

(58) Field of Classification Search
CPC ................................. G09B 9/00; G09B 19/24
See application file for complete search history.

(56) References Cited

U.S. PATENT DOCUMENTS

| | | | | |
|---|---|---|---|---|
| 5,855,553 | A * | 1/1999 | Tajima | A61B 34/70 600/407 |
| 7,991,509 | B2 * | 8/2011 | Lipow | A61B 34/30 606/1 |
| 2022/0293014 | A1 * | 9/2022 | Fisher | G09B 23/285 |

FOREIGN PATENT DOCUMENTS

| | | | | |
|---|---|---|---|---|
| KR | 20210091739 A * | 7/2021 | | G06F 3/0304 |
| WO | WO-2024006348 A1 * | 1/2024 | | G06F 3/011 |

* cited by examiner

*Primary Examiner* — Robert J Utama
(74) *Attorney, Agent, or Firm* — IP Consulting Group; Michael Razavi; Alfred F. Hoyte, Jr.

(57) ABSTRACT

This invention introduces an apparatus and method for enhancing team and leadership skills through simulation-based training programs, known as the Team Results Methodology (TRM). The invention enables improvement in accuracy and outcomes of simulation by monitoring user performance and delivering focused feedback for iterative skill development. A key component of invention is a switching device that optimizes simulated task execution by monitoring participants and objects involved in a simulation. The device features a housing with input/output terminals, a microprocessor, sensing modules, and a transmitter/receiver module. It interprets signals from sensors detecting object interactions, such as boundary crossings or positional changes, triggering real-time alerts to provide feedback to participants and facilitators. By recording and analyzing alerts, the apparatus ensures dynamic, adaptive simulations that refine teamwork and leadership training outcomes.

16 Claims, 9 Drawing Sheets

| Team codewords | |
|---|---|
| 1 | CHORUS |
| 2 | BAGELS |
| 3 | ABACUS |

401

| | 1 | | 2 | | 3 | |
|---|---|---|---|---|---|---|
| | Challenge | Response | Challenge | Response | Challenge | Response |
| 1 | QUE | C | HTC | B | ADC | A |
| 2 | RBZ | H | JTW | A | BHD | B |
| 3 | DXI | O | LKI | G | CES | A |
| 4 | NYH | R | BVW | E | CSA | C |
| 5 | KFS | U | PYK | L | GHR | U |
| 6 | VCD | S | TRF | S | FEI | S |

| Team 1 | Team 2 | Team 3 |
|---|---|---|
| Authentication code 1 is QUE | Authentication code 1 is HTC | Authentication code 1 is ADC |
| Authentication code 2 is RBZ | Authentication code 2 is JTW | Authentication code 2 is BHD |
| Authentication code 3 is DXI | Authentication code 3 is LKI | Authentication code 3 is CES |
| Authentication code 4 is NYH | Authentication code 4 is BVW | Authentication code 4 is CSA |
| Authentication code 5 is KFS | Authentication code 5 is PYK | Authentication code 5 is GHR |
| Authentication code 6 is VCD | Authentication code 6 is TRF | Authentication code 6 is FEI |

402

Fig. 4

LOGO

120

Team Name

Team Dashboard®

This two-page questionnaire takes five minutes to complete. We'll get the results to you within one week of receiving the last return. The results are for your use, and they will also be used by others to get a viewpoint on whether teamwork and leadership has had a big effect on the Key Performance Indicators currently used by your organization to track the team's performance.

Part One

Part One asks you to look at your team's Key Performance Indicators and, for each one, decide how much of a contribution *teamwork and leadership specifically* makes to your team's performance *in that area*.

For each Key Performance Indicator, *tick one box* to indicate your view on this.

| | | *Tick one box in each row* | | | | |
|---|---|---|---|---|---|---|
| | Teamwork and Leadership is... | Very important | Fairly important | Averagely important | Only slightly important | Not important at all |
| 1 | On-time delivery | | | | | |
| 2 | Cost control | | | | | |
| 3 | Client satisfaction | | | | | |

Fig. 7A

Part Two asks you to give *a score out of ten* for each question. Please decide how the team is handling things at the moment and pick a score. *Zero is the lowest* score and ten is the *highest* - the Score Guide below will help The questions refer to *the work team involved in this specific Program,* rather than any other work team you may belong to. For each question, give a score out of ten per the above to indicate your view.

122

Score Guide

0 Extremely poor - No success whatever
1 Very poor - Successes happen very rarely
2 Quite poor - Occasional patches of success, but mostly failure
3 Well below average - Somewhat more failures than successes
4 Below average - Slightly more failures than successes
5 Average - As many failures as successes
6 Above average - Slightly more success than failures
7 Well above average - Somewhat more success than failures
8 Quite good - Occasional patches of failure, but mostly success
9 Very good - Failure is very rare
10 Extremely good - No failures at all

Planning our work

| | *I believe my team...* | Score out of 10 |
|---|---|---|
| 1 | Is clear about its purpose within the organization. | |
| 2 | Regularly consults all members to discuss and agree on its goals. | |
| 3 | Thoroughly explores and gathers all the data it needs to do its job. | |
| 4 | Encourages all members to contribute ideas when decisions affecting the team are being made. | |
| 5 | Builds on each others' ideas and explores alternative actions. | |
| 6 | Has clear action plans for each team member setting out what, by when and how well each person needs to contribute. | |

Getting the work done

124

| | *I believe my team members...* | Score out of 10 |
|---|---|---|
| 7 | Do what they have agreed to. | |
| 8 | Keep each other informed so that others know what is happening. | |
| 9 | Help each other solve problems. | |
| 10 | Raise and deal openly with conflict. | |
| 11 | Take responsibility for the quality of their service delivery. | |
| 12 | Seek and use feedback on progress. | |

Reviewing progress

| | *I believe my team...* | Score out of 10 |
|---|---|---|
| 13 | Regularly takes time to assess results against Key Performance Indicators. | |
| 14 | Encourages questioning on the way we do things. | |
| 15 | Actively seeks team views on the effectiveness of work processes and team communications. | |
| 16 | Regularly assesses progress made on plans to keep the skills base of the team current. | |
| 17 | Systematically seeks feedback from clients to help improve results and team processes. | |
| 18 | Regularly asks all team members "how can we do it better". | |

Fitting into the big picture

| | *I believe my team...* | Score out of 10 |
|---|---|---|
| 19 | Is seen as a winner by others. | |
| 20 | Is kept in touch with what the organization is doing. | |
| 21 | Gets regular feedback about its contribution to the organization. | |
| 22 | Is involved in decisions which have an effect on it. | |
| 23 | Values and uses individual talents for the benefit of the organization. | |
| 24 | Celebrates success and provides recognition to individuals. | |

FIG. 7B

Team Dashboard Report

APPARATUS AND METHOD FOR MONITORING AND DETECTING FAULT CONDITION

FIELD OF THE INVENTION

The present invention relates to an apparatus and method for building team and leadership skills using simulation-based training programs. More particularly, the invention is directed to an apparatus and method for improving accuracy and outcome of simulations designed for building team and leadership skills by monitoring user performance and providing feedback to more narrowly focus subsequent simulations.

DESCRIPTION OF THE PRIOR ART

For years, businesses, organizations, the military, and similar groups have utilized a variety of training methods to foster team and leadership skills. These programs generally fall into two broad categories, which sometimes overlap. The first category consists of lectures and PowerPoint® presentations, which are often held with group activities and breakout sessions. This approach depends mostly on rote learning, sometimes augmented by targeted work sessions. The second category includes team-building activities, such as escape rooms, ropes courses, and other similar interactive games. Although these programs offer some value, they suffer from several drawbacks. First, with respect to the first category, the objective of these programs is to bring behavioral change, an objective that cannot be attained very easily by mere rote learning. Rote learning can only teach responses to predictable, re-occurring situations which can be useless when unforeseeable situations occur. Secondly, retention of the information disseminated can be less than desirable, especially for unmotivated attendees who attend a shortened or "crash" course. Finally, the program's success greatly depends on the interpersonal skills of the instructor. If the course instructor lacks strong interpersonal skills, their efforts may be undermined from the start, as many attendees could lose interest as soon as the lecture or presentation begins.

The second category of training methods suffers from its own set of drawbacks. Traditional team-building games are not fruitful because of their familiarity. Most participants have already gone through these activities which not only makes them predictable but also prone to premeditated responses to the expected scenarios. In addition, most conventional training methods cannot provide the high levels of cognitive stimulation and enthusiastic engagement needed to capture the brain's attention and inspire meaningful behavioral change. In other words, the training method becomes too monotonous to be effective. Activities like escape rooms or ropes courses, which rely on artificial and forced excitement, are often irrelevant or unhelpful in workplace contexts and can be uncomfortable for some participants.

The present invention addresses the limitations of traditional team and leadership skills training programs by introducing a simulation-based training approach, eliminating the reliance on conventional course instruction. The inventive method is known as the Team Results Methodology (hereinafter TRM). The simulations of the invention, which are variable, adaptable, and modifiable, focus on employing rehearsal, re-calibration, and retrial of actual leadership behaviors to create neural pathways in the brain—similar to riding a bike—that support behavioral change. The needed behavioral outcomes are decided by the participants and their leadership, not by the instructor/trainer.

SUMMARY OF THE INVENTION

Apparatus and/or methods are provided for improving accuracy of accuracy of a simulation event within a training program involving a plurality of individuals substantially as shown in and/or described in connection with at least one of the figures, as set forth more completely in the claims.

According to an embodiment, an apparatus is disclosed for enhancing the outcomes of simulated tasks within a training program involving multiple individuals performing various execution components. Each execution component involves one or more objects, with each object characterized by one or more attributes including a defined boundary, a size, initial position, or orientation. The apparatus comprises a switching device having a housing equipped with at least two input terminals and at least two output terminals. The device includes a microprocessor, sensing modules, and a transmitter/receiver module. The device is programmed to receive and interpret analog or digital signals generated by one or more sensors placed to detect when an object's boundary is crossed or when its initial position or orientation changes. Based on interpretation of these signals, the switching device is programmed to transmit a signal to one or more output devices. The switching device may have multiple operational modes and is configured to operate in one of these operational modes. One of the operational modes may be a remote operating mode, where an output device generates an alert in response to a transmitted signal. Another operational mode may be a tilt mode, where an alert is triggered by a change in the device's orientation. The changes in the device's orientation are detected by one of its sensing modules. Alerts are recorded in real-time to create a comprehensive list of alerts for each simulation. The operational mode of the switching device is determined by the specific execution component.

According to an embodiment, the output generated by the switching device may be an audible, visible, or haptic alert.

According to an embodiment, the input terminals receive analog signals from the sensors.

According to an embodiment, the input terminals receive digital signals from the sensors.

According to an embodiment, the output terminals transmit analog signals to the output devices.

According to an embodiment, the output terminals transmit digital signals wirelessly to the output devices.

According to an embodiment, the housing of the device is transparent.

According to an embodiment, a method is provided for improving the accuracy of simulation events within a training program involving multiple individuals performing multiple simulations. Each simulation incorporates one or more objects, each object having at least one alterable physical parameter. The method includes programming one or more switching devices to directly or remotely detect changes in the physical parameters of the objects and generate an alert signal in response to such changes. The alteration of the physical parameter triggers the alert signal to be emitted either directly from the switching device or via a remote alerting device. The switching device may have multiple operational modes and is configured to operate in one of these operational modes. One of the operational modes may be a remote operating mode, where an output device generates an alert in response to a transmitted signal. Another operational mode may be a tilt mode, where an alert is triggered by a change in the device's orientation. The operational mode of the switching device is determined based on the specific simulation being conducted.

According to an embodiment, the simulation has several alterable physical parameters, and the switching device receives triggering signals from sensors positioned to sense alteration of one or more of said alterable physical parameters.

According to an embodiment, the switching device includes an accelerometer.

According to an embodiment, one of the sensors is a pressure mat.

It is a major object of the invention to provide an apparatus and method for application in training programs to build team and leadership skills.

It is another object of the invention to provide an apparatus and method of training to build team and leadership skills that uses multiple, variable simulations.

It is another object of the invention to provide an apparatus and method of training to build team and leadership skills that uses feedback from simulations to adapt and improve subsequent simulations.

These and other objects of the present invention will become readily apparent upon further review of the following specification and drawings.

The present invention meets or exceeds all the above objects and goals. Upon further study of the specification and appended claims, further objects and advantages of this invention will become apparent to those skilled in the art.

BRIEF DESCRIPTION OF THE DRAWINGS

Various other objects, features, and attendant advantages of the present invention will become more fully appreciated as the same becomes better understood when considered with the accompanying drawings, in which like reference characters designate the same or similar parts throughout the several views, and wherein:

FIG. 4 is a diagram illustrating a component of the invention.

FIG. 7A is a diagram of a diagnostic tool used with the invention.

FIG. 7B is a diagram of a diagnostic tool used with the invention.

DETAILED DESCRIPTION OF THE PREFERRED EMBODIMENTS

Figure 1:
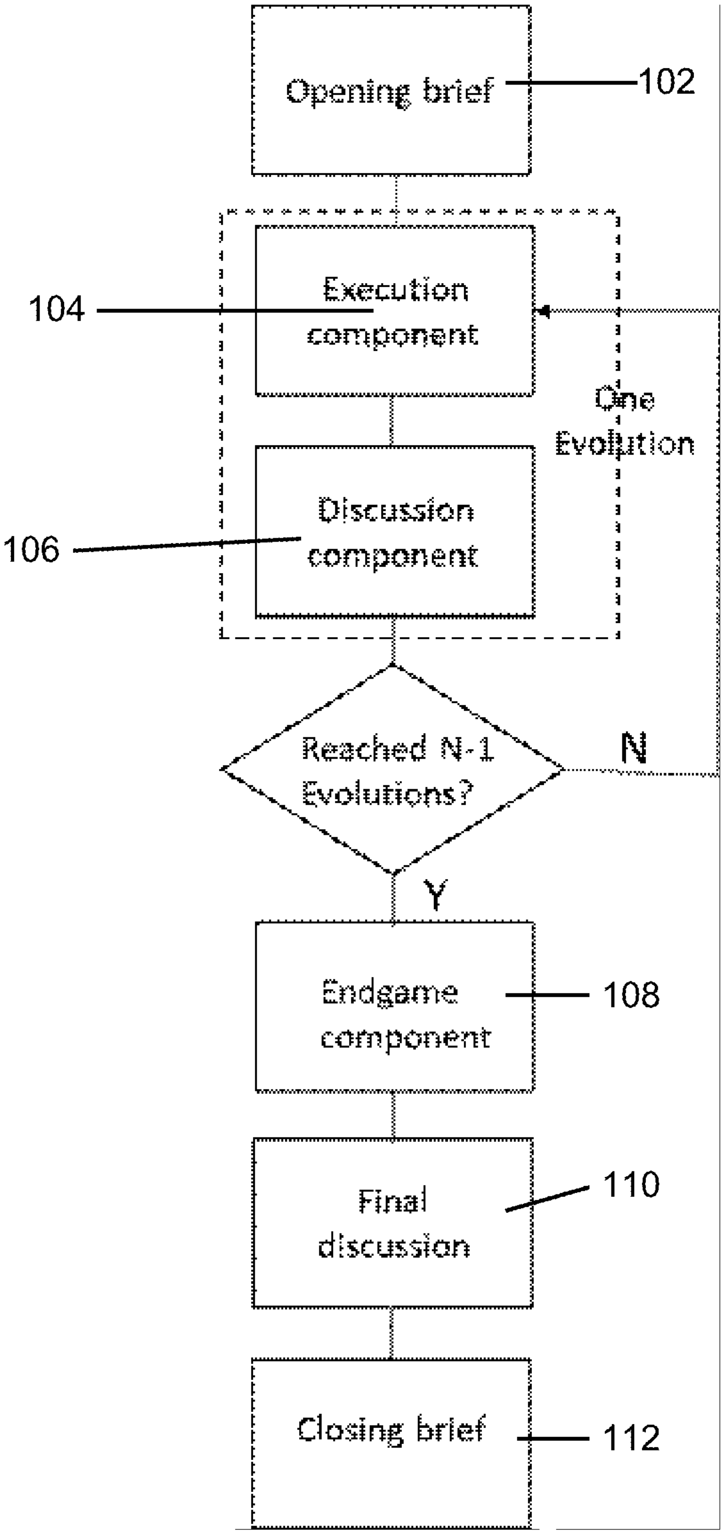
FIG. 1 shows a flowchart outlining the method of the invention.

The Team Results Method is concerned with creating group behavioral change using a variety of simulations led by instructors or facilitators that control the various scenarios and assess the responses of the participants in the group. The essence of facilitating the simulations is that people make their own discoveries about what works and what does not work. Through managing the simulations, each and every group member needs to find their own certainty by repeatedly formulating, testing and refining their own assumptions. Teamwork (enhanced by causing behavioral change) is the end objective but ultimately it is the decision of the individual participants to unite and support a shared vision based on their own discoveries that makes big visions and ambitious projects succeed. While the simulated task—though vital to the invention—is just a means to an end, the values, strategies, and relationships people create together in order to meet the demands of the task are critical. Therefore, the control the instructors surrender as facilitators (of the simulation) must be genuine.

Since the purpose of the simulation is to create a success within the group's client structure, the instructors should observe the legitimate rules and structures of the client at all times. This includes following OH&S guidelines, not disrupting production, and supporting client values. As facilitators it is important that the instructors have clarity on the desired business outcomes from the simulation. The instructor must be constantly aware of the desired business outcomes. It should be noted here that the term facilitators and instructors may be used interchangeably.

A key aspect of the invention is that the preliminary, intermediate, and final components of the inventive method are unchanged regardless of the actual simulations. Program durations are described below. Shortened variations of the method may be used, but they are just a condensed version of the core method as will be explained in more detail later. So, the discussion of the preliminary, intermediate, and wrap-up stages provides a description of the sequence of events, independent of timing or any specific simulation or task, except where explicitly indicated. Finally, while simulations are used, they may vary (or be replaced entirely with new simulations) over time and the exemplars given are only to illustrate their use within the context of the inventive method.

The following is a list of terms and definitions used in this document.

A BFD. Is a proprietary electronic microcomputer used for providing behavioral feedback to teams that is fully described in a separate section of this document.

BRIEF. As used herein a Brief is a discussion in which information is given to participants (also called teams or groups when used in plural).

CASE STUDIES. Real-world examples of relevant experiences in other organizations from which may be selected and shared during Discussion Components according to need.

CLIENT. An organization or business from which teams of participants are assembled.

COMPONENT. Any part of a Program that is Execution or Discussion.

COMPUTER PROGRAM. A collection of computer code used to define and execute a computational function within a BFD.

DISCUSSION COMPONENT. Is a phase lasting 45 minutes to one hour, during which the team reviews and discusses its experiences from the execution component, documenting insights into effective and ineffective team and leadership strategies.

EVOLUTION. One cycle of a Program consisting of an Execution Component followed by a Discussion Component.

EXECUTION COMPONENT. A phase of 45 minutes to an hour during which the team works on a custom designed problem intended to simulate one or more aspects of teamwork and leadership relevant to their stated needs (provided by the client). The Execution Component is either a physical problem set up (usually outdoors) for an in-person Program, or an online challenge set up online for an Online Program.

IN PERSON PROGRAM. Is a Program run in person in physical spaces using a variety of physical tools and props with participants attending together at a physical location.

NOTES. Refers to the notes taken by facilitators using a medium (e.g., blackboard, whiteboards) visible to the whole group during Discussion Components that are formatted with a view to (1) immediate usefulness to the group and (2) later compilation into a "Discoveries Manual" of outcomes and strategies that is shared after the program with participants and which constitutes the published proceedings of the Program.

ONLINE PROGRAM. A Program run online with no physical contact and all its Components run in cyberspace using a variety of online tools and props.

PROGRAM. A complete single event for a client containing all the Components. This should be distinguished from a Computer Program.

SIMULATION. Is the concept of learning by going through the reinforcement of neural pathways in the brain, resulting from direct practice and rehearsal of desired behaviors by working on a custom designed problem together.

SYNDICATE. A style of Discussion Component in which participants are divided into sub-teams to discuss their views and then invited to present to the whole group.

TRM OR TEAM RESULTS METHODOLOGY. The definition of TRM or Team Results Methodology is that The TRM or Team Results Methodology is the overall name for the complete approach and Intellectual Property (IP) described in this document as a whole.

TOOLS. A library of tips, techniques and methodologies from which facilitators select and share during Discussion Components according to need.

TOWN HALL. A style of Discussion Component in which participants are together in one physical or online space and discussions are held in one large group.

This concludes the list of terms and definitions used in this document.

Figure 2:
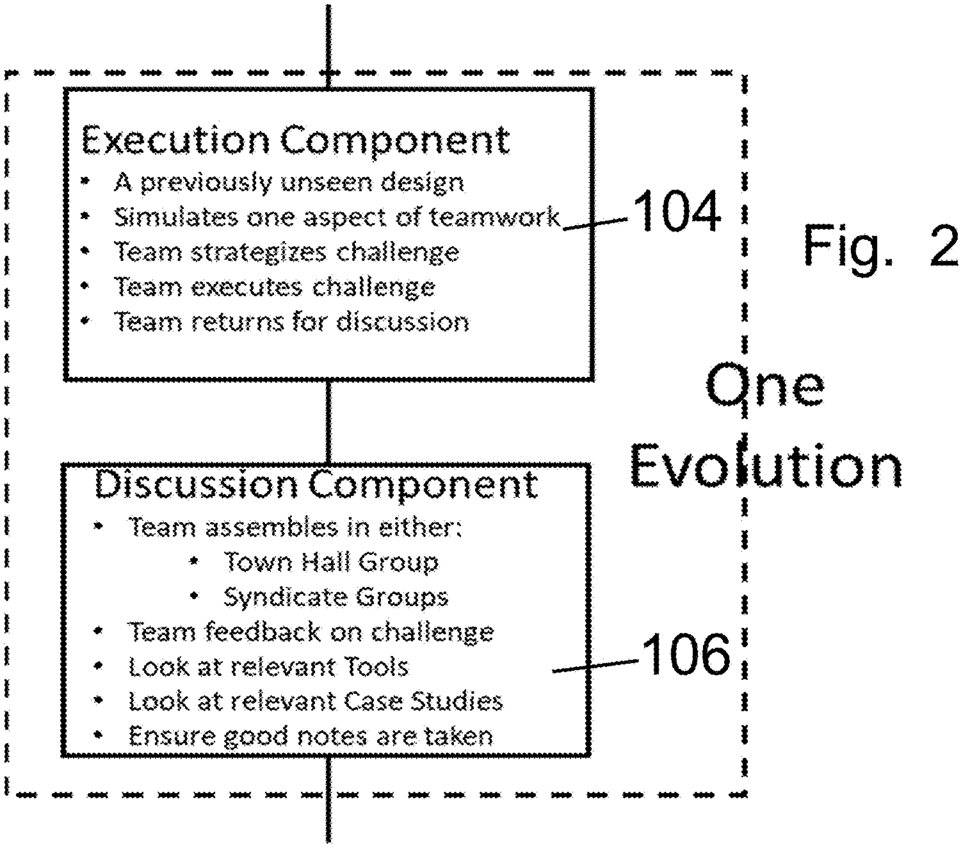
FIG. 2 is a diagram detailing a component of the invention.

A flowchart of the design for a Program appears in FIG. 1. An exploded detailed diagram of an Evolution appears in FIG. 2. As can be seen in the flowchart, there are three primary components to the inventive method as discussed below.

Execution Component

Each Program gives participants the opportunity to discover and rehearse the new skill sets they requested, without getting bogged down in day-to-day workplace trivia. Each Execution Component consists of a Simulation-based problem given to the team at which they have some mixture of success+ and failure, before heading back for discussion. No Execution Component is repeated more than once over the course of a single program. The challenges (simulations) presented are pulled from a continually changing library of original challenges—all created by the company, and each challenge is chosen according to the needs of the client. Any given challenge may be adapted to fit a particular client's needs and stated goals. Alternatively, new challenges may be designed based on the client's need. When a challenge has been seen before, it ceases to be a useful Simulation because the response is memorized and not spontaneous. It also creates inequality in the team between those who have seen it and those who have not. The inventive methodology includes a database to track all participants who have seen each of the past and present repertoire of Execution Components, so that no repeat participant is presented with an Execution Component they have seen before. Challenges are either adjusted or different ones chosen, depending on the circumstance. Each Execution component focuses on a subset of teamwork and leadership themes relevant to the stated needs of the client. During the Execution Component, participants are presented with a challenge, strategize to solve the challenge, and meet to discuss during the Discussion Component.

Each execution component is defined by one or more objects. These objects are characterized by their distinct attributes, including a boundary, a size, an initial position, or an orientation. Each object in the execution component may also be characterized by their attributes relative to another object in the execution component. For example, the size or position of one object may be defined with respect to the size of position of another object. This setup allows for identification and manipulation of objects within the system in a precise manner.

Discussion Component

Each discussion component consists of a group discussion where participants can examine what worked and what did not, consider what they learned, and make a plan for the next challenge. The discussion Component proceeds by assembling the group into Syndicate groups or a Town Hall group where feedback from the challenge is discussed, with a facilitator moderating the discussion and making notes as necessary. Tools and past case studies may be used to help analyze and focus the discussion.

Final Component

After the desired number of evolutions of the program are complete, there is a final discussion component centered around the participants performance and discoveries made during previous evolutions, and around a number of tools introduced throughout the syllabus at the discretion of facilitators on the basis of relevance and usefulness to the group. Also offered and usually included are the production and delivery of the Notes as a Discoveries Manual, measurement of the results with the existing trademarked Team Dashboard™ instrument and up to three Follow-up Sessions after the Program (in person or online).

Referring now particularly to FIG. 1, it can be seen that each program starts with an opening brief 102 to present the challenge, the brief including general instructions (orientation, logistics, etc.). The group then proceeds to and performs the challenge (Execution Component) 104 after which there is a meeting to discuss (Discussion Component) 106 the challenge, this completing a single Evolution. The Evolutions are repeated as necessary or as time permits, until $N-1$ Evolutions are completed, where N is the total number of Evolutions for the program. The Nth Evolution consists of an Endgame Component 108, a final discussion 110, and a closing brief 112. A key aspect of the invention is that the above-described components are performed for every Program. While the challenges may be adjusted or replaced as the facilitators feel is necessary, the inventive method is applied in the same manner for every Program.

The details of the aforementioned components, including a description of several challenges are discussed below. The inventive methodology creates an environment for participants to learn any number of skills, but all of them fall under the heading of Teamwork and Leadership.

Programs

There are several types of programs as can be seen in Table I below, but each employs the 3-stage approach as outlined above.

TABLE I

| | Format | | |
|---|---|---|---|
| Duration | In-person | Virtual | No. of Evolutions |
| Short | 1 day of about 8 hours | 1 morning online | 3 |
| Mid-length | 2 days of about 16 hours | 2-3 mornings online | 4 to 5 |
| Flagship length | 2½ days full time | 5 mornings online | 7 to 8 |

It is noteworthy that the Short Program for In-Person Programs is conducted on a non-residential basis. The Medium program is non-residential but an overnight stay can be added if desired. The long or Flagship program is residential, involving two successive overnight stays. The online programs are packaged as several half-day sessions delivered over consecutive days. In-person programs vary and may be consecutive half-days, consecutive full-days, or residential programs where the participant is present for several days at a time.

The primary difference between online and in-person programs is the challenges themselves. Obviously for an in-person program, the challenges are physical constructs in a physical world executed by physically present teams of people and no part of these in-person challenges is online, or generally, even indoors. Typically, the challenge is set up outdoors, partly because this is far more effective than indoor stagnation and partly because the physical size needed to make these challenges worthy of intelligent adults is too large to fit indoors.

It should be noted that the online programs include two hours of personal coaching per person after the program which is not offered in the in-person version. The purpose is to account for the difference in intimacy and personal relationships enforced by an online, non-residential environment by offering a personal coaching relationship. The in-person version of these programs offers ample opportunity for these discussions to happen organically at the venue.

For all Programs, participants will spend about half their time on Execution Components, and half their time on Discussion Components. Both are equally important.

A key aspect of the invention is that a program does not consist of just the Execution Components or just the Discussion Components. Part of what makes the inventive methodology unique is the ability to fuse and blend these components into a coherent whole that is narratively satisfying, directly relevant to the needs of the client, and unique enough to be memorable and sustainable for people and teams for many years afterwards. The production of a Discoveries Manual (which charts the discoveries made by team members), and offering every client up to three Follow-up sessions and measurement of the results with Team Dashboard™ (explained below), are also key parts of the inventive methodology. It is inherent to the methodology that follow-up is highly desirable and will be offered and strongly encouraged, and also that the Team Dashboard™ measurement is highly useful.

Referring now to FIGS. 7A-8B, Team Dashboard™ is a proprietary measuring instrument for tracking team productivity against the client's own organizational performance indicators. Team Dashboard™ is not a personality-assessment tool, it is a scientific instrument that directly measures team productivity changes at work.

Team Dashboard™ provides two main readouts-a measurement of work team productivity change over time, and a measurement of the exact impact of productivity change on the client's own specific organizational performance indicators. Team Dashboard™ also yields a large amount of immediately useful diagnostic information, very similar to an X-ray or Magnetic Image Resonance (MRI) image for work teams.

There are two parts to Team Dashboard™. Part One 120 consists of a list of organizational performance indicators obtained from the client, and relative percentage weightings of these as a part of organizational performance as a whole. Part Two 122 consists of 24 behavioral indicators grouped into 4 categories of team performance, each rated from 0 to 10. Results from Parts 1 and 2 are released to the client in tabulated form accompanied by statistical analysis, and are also combined by facilitators into an overall analysis which shows and graphs changes and improvements in performance against organizational performance indicators arising from improvements in team performance after a Program. This also permits statistical testing to reliably establish if any improvement in organization performance obtained by a Program was causal or random. A Team Dashboard™ questionnaire 124 appears in FIG. 7B and a sample Team Dashboard™ management report 126 appears in FIGS. 8A and 8B.

Figure 6:
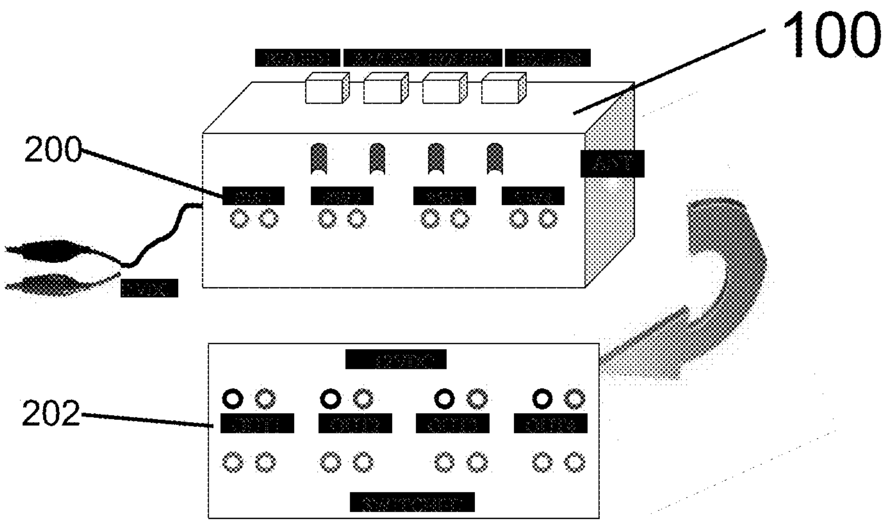
FIG. 6 is a diagram of a switching device used with the invention.
Figure 8A:
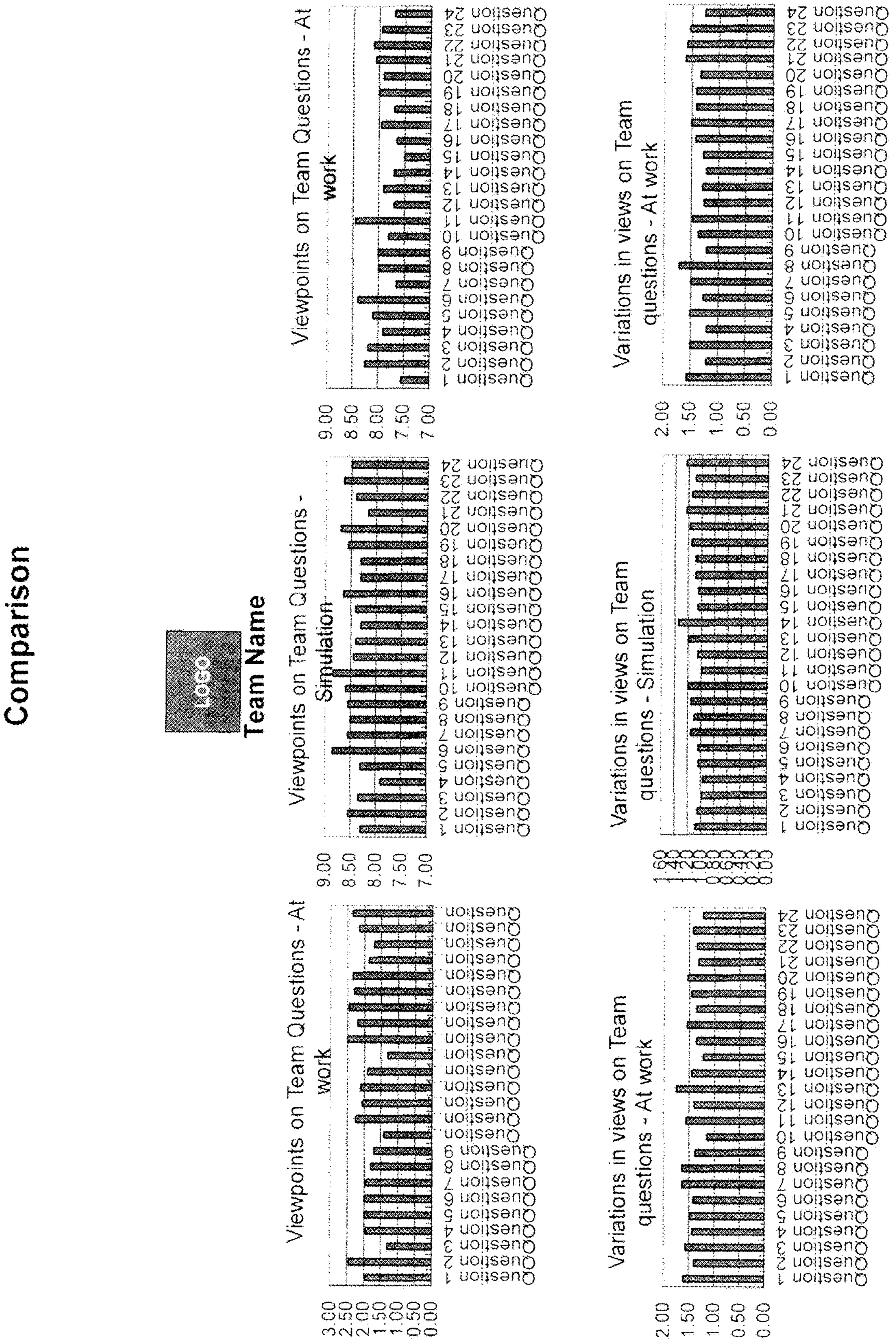
FIG. 8A is a diagram associated with the tool of FIGS. 7A and 7B.
Figure 8B:
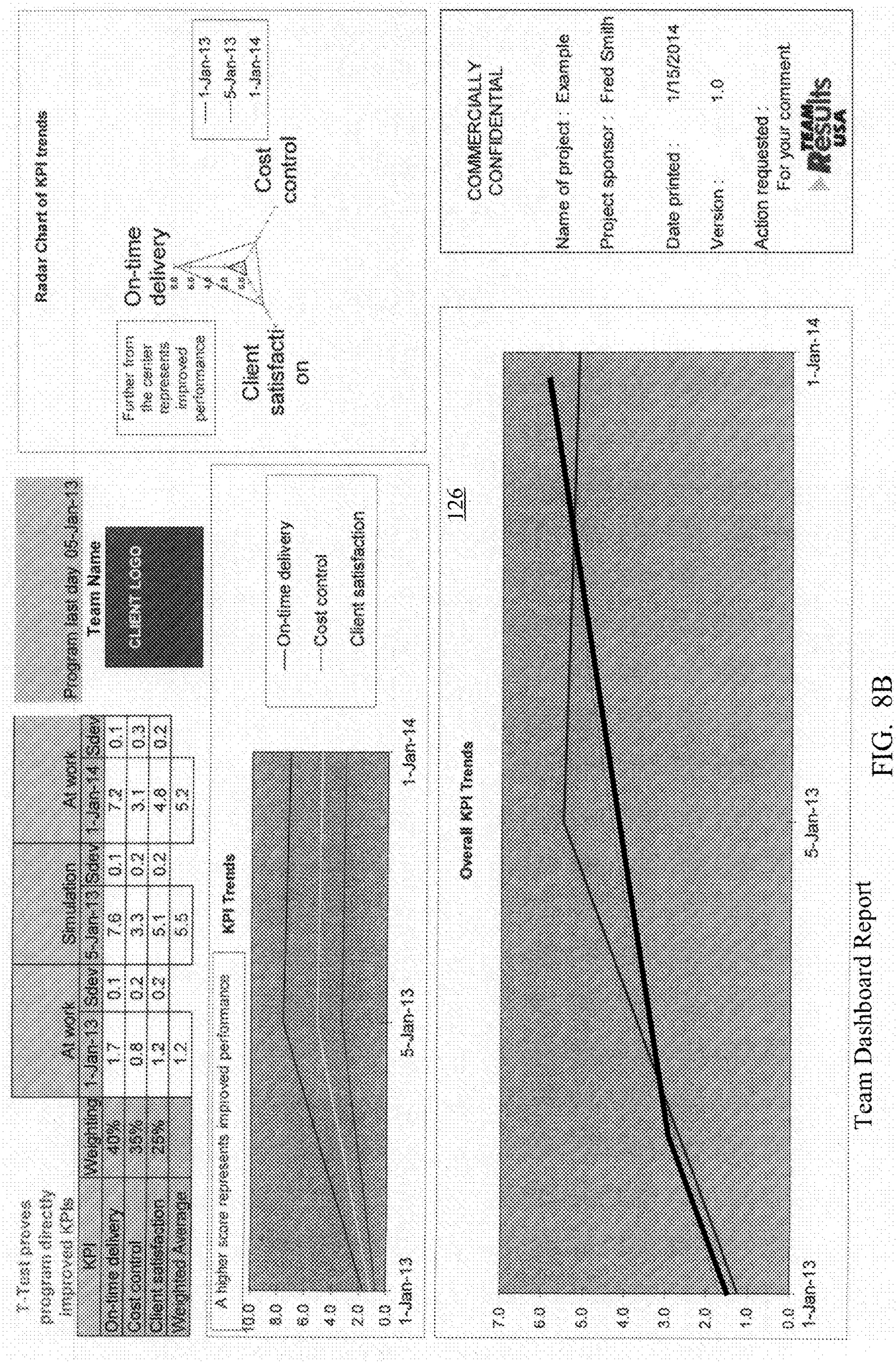
FIG. 8B is a diagram associated with the tool of FIGS. 7A and 7B.

Referring now to FIG. 6, a diagram of the programmable switching matrix used with the inventive method is shown. The device, which may be termed as a Basic Feedback Device (BFD) and indicated by the number 100, has four inputs 200 and four outputs 202 with programmable microprocessor-controlled switching, as well as other functional components as explained below. The BFD 100 can be programmed and connected as the thinking, or consequence-calculation, component of many different Execution Components of the invention. The BFD 100 is fully programmable, enabling it to provide a wide range of possible consequences to an equally wide range of possible input conditions. Four different switched input conditions and four different switched or voltage output conditions give the BFD 100 a total of 16 different machine states at any given time, along with the capability to remember previous states and to poll onboard sensor modules such as a solid-state GPS and remote radio trigger circuit, all of which also permit data to be included in the computation of consequences. Put another way, the device 100 can provide an alert in response to a predetermined condition, but can also record its activity so as to provide useful data. The device 100 is therefore an important component in the overall presentation of many, though not all, of the possible simulated challenges which can be run. It provides facilitators a crucial component of computational complexity and real-world consequence to its simulation designs.

The algorithm for the BFD 100 has a number of programs that enable it to act as the "brain" and decision-maker as to the consequence of team decisions made in different types of Simulation components. The idea is to simulate consequences in a real way, by triggering a sound or some other indication on the basis of inputs generated from team actions, thus providing the team with inarguable feedback as to their dynamics and operation. The use of a switching device rather than just (for example) yelling "that's wrong" is consonant with the inventive principle of "naturalness" and is responsible for much of the ready acceptance of feedback by teams as to their level of operation- and to their openness to any team or personal adjustments which can be made.

Naturalness, as used herein, is achieved by using actual devices and props in simulations, as opposed to artificial constructs like telling participants that the floor is imaginary lava. Engaging a 25-year-old "facilitator" to instruct a group of experienced and highly qualified adults with activities such as "imagining the floor as lava" or penalizing them for stepping over a chalk line may elicit adverse reactions. These responses are often misaligned with the behavior modification objectives of the present invention. With the aid of much better challenge designs and BFD 100, that pretense can be abandoned in favor of naturalness. Grass is grass, not lava, and a chalk line is just a chalk line put there to help them. But if they make certain mistakes, they will definitely trigger a real device that will destroy some information they need or provide some other programmed response. The naturalness and non-pretense of the problem greatly increases acceptance and learning, while also eliminating ridicule and dismissal, thereby promoting an environment conducive to the objectives of the invention.

The inputs 200 are electrical terminals configured to receive analog or digital input signals from various sensing and alerting devices. The sensing or alerting devices may be hardwired, that is, directly connected to the BFD 100 via wires. Alternatively, a receiver for receiving signals from the various sensing and alerting devices may be "plugged" into an input 200 to allow for remote sensing devices, thereby eliminating wires which may be a unsightly or a tripping hazard depending upon the layout of the simulation. In another embodiment, the BFD may include wireless transmitter/receiver module to wirelessly communicate with the various sensing and alerting devices. In order to give facilitators latitude with creating different scenarios for the simulations, the BFD 100 must be capable of receiving signals corresponding to a wide variety of triggering events. Accordingly, the input signals may be received from various types of sensing and alerting devices such as proximity sensors, heat and light sensors, accelerometers, etc., to give facilitators many options when designing simulations. The BFD device 100 itself has one or more sensor modules and at least an audio transducer positioned therein, but in order to limit the number of BFDs 100 needed for simulations, the device 100 can receive inputs from one or more sensors positioned in the simulation area. In an exemplary embodiment, the BFD may comprise sensors for detecting linear and angular motion of the BFD. Examples of such sensors include an accelerometer and a gyroscope. In another exemplary embodiment, the BFD may comprise proximity sensors for detecting obstacles, presence of nearby objects, and recognizing gestures. Thus, the BFD 100 device itself may be used as both the sensor and the alerting means, while affording the user the option to input, via a wired or wireless connection, received signals from one or more external sensors.

The BFD output terminals may be connected to a wide variety of output devices such as (but not limited to) an audio transducer, a detonator for a small explosive, or strobe, the outputs 202 outputting a digital or analog signal depending upon the receiving output device. The output terminals may also be configured to transmit signal wirelessly to output devices.

Figure 9:
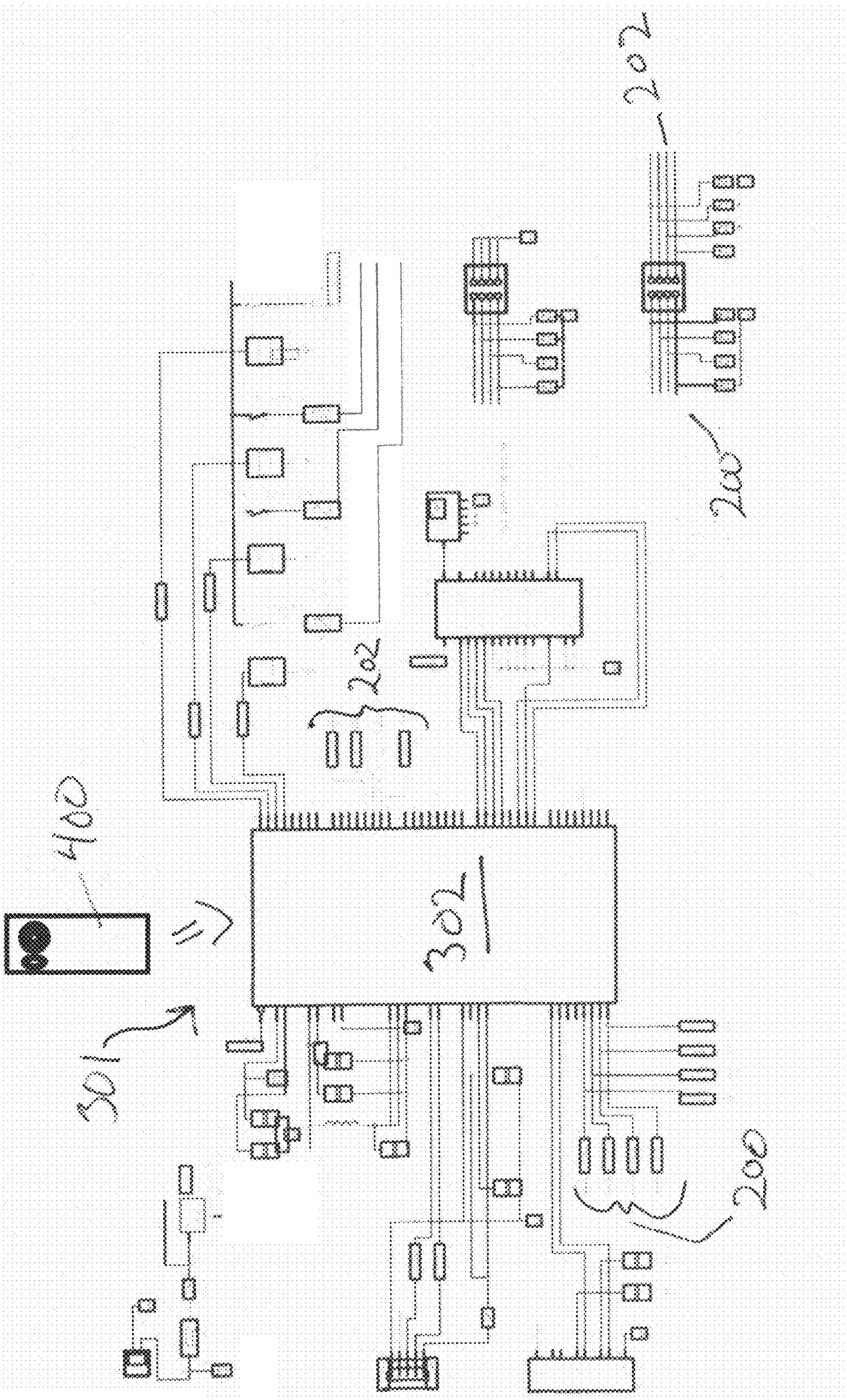
FIG. 9 is a schematic of the circuitry of the switching device of FIG. 6.

Referring now to FIG. 9, in view of FIG. 6, a schematic 301 of the BFD 100 is shown. A microprocessor 302 is the main controller of the BFDs operations, and receives the inputs 200 from the various sensors and provides an output signal in response to a sensor generating a signal. The sensors, in some instances pressure mats, may be polled by the microprocessor 302 upon startup to determine operational status, thereby affording the user an opportunity to avoid delays (or "inaccurate" simulations) caused by failed sensors, which is not an uncommon problem. BZ/LED1-BZ/LED4 are external (illuminating) buzzers which can optionally be triggered by each of SW1-SW4 being closed respectively, as determined by the software controlling microprocessor 302. That is, BZ/LED1-BZ/LED4 will be activated depending upon sensor inputs from a wide variety of sensors, user input, and the position of switches SW1-SW4, all of which is done in accordance with the rules of the particular scenario. The housing of the BFD 100 is water resistant and transparent or translucent and the LEDs 1-4 are contained therein and thus are visible to the operator. The transparent housing allows for visualization of the circuitry so that any obvious physical problems with the unit can be assessed, while making the unit 200 much less susceptible from damage due to environmental problems (e.g., rain or moisture). Also, for example, airport security personnel can view the interior of the unit which can be a convenience when traveling with the unit to perform a simulation. When each of SW1-SW4 is closed its respective LED1-LED4 is illuminated. An external antenna 310 is plugged into the microprocessor 302 for receiving radio signals.

In an Execution Component, the BFD 100 may receive input signals from one or more remote sensing device in response to detection of certain events by the sensing devices e.g., in response to change in one or more attributes of objects which are part of the Execution Component. For example, at least one sensing device may sense when an individual or an object crosses the boundary of another object. In response, the sensing device may transmit a signal to the BFD 100 indicating the crossing of the boundary of the object. In another example, the sensing devices may sense when an initial position, size, or orientation of an object is altered.

The microprocessor 302 may be programmed to analyze and interpret the signals received from the sensing devices. Such signals may be received by the microprocessor from remote sensing devices and/or sensors provided in the BFD 100. In response, the BFD 100 may generate an alert signal and transmit the signal to an output device such as an audio transducer. The alert signal may include but is not limited an audible, visible, or haptic alert signal.

Each of OUT1 (202)-OUT4 (202) has two options, VOLTAGE output 203, equal to voltage input or SWITCHED output 205. Other inputs—other than SW1-SW4—which can be used by the microprocessor 302 to set the output states of OUT1-OUT4 are:

1. TILT change angle—in 3.5-degree increments from the internal accelerometer to allow for a user to determine if the BFD 100 unit has been tilted.
2. Determination of a user transmitted radio signal as received by antenna 310 via Channel A or Channel B.

The radio transmitter fob 400 switches the BFD 100 between modes, two of which are mandatory—Tilt mode and Remote mode. The BFD 100 may theoretically have many modes of operation but is preferably limited to 4 for operational simplicity. When in remote mode the BFD 100 triggers an alert in response to a facilitator observing a simulation. When in tilt mode the BFD 100 triggers an alert in response to tilting of the unit. The other modes are all operated by different rules applied to the four switches that correspond to different team challenges triggered by such devices as pressure-sensitive mats. Thus, based on the state of up to 4 switched inputs, facilitator interaction, and the physical state of the unit 100, the BFD 100 generates (and can store) useful data from the simulations.

The code for "Tilt Mode", one of many possible operational modes for the BFD 100, is shown below. In Tilt Mode the BFD 100 triggers a voltage output if the physical orientation of the device 100 is altered by more than a few degrees (by the action of a participant) of arc, after an initial calibration period.

```
BEGIN
SET OUTPUT1 TO LOW (should be default)
SCAN ACCELEROMETER ANGLE AND STORE AS A1
EMIT A BEEP EVERY SECOND FOR 10 SECONDS
SELF-ARM
  BEGIN
  SCAN ACCELEROMETER ANGLE A2
  IF A2.NOT-EQUAL-TO.A1
    OUTPUT1 SET TO HIGH FOR 10 SECONDS
    SET A1 EQUAL TO A2
    SET OUTPUT1 TO LOW
  END
END
```

Examples of Execution Components

Ali Baba

"Ali Baba" is an example of a physical Execution Component used in an In-person Program.

Figure 3:
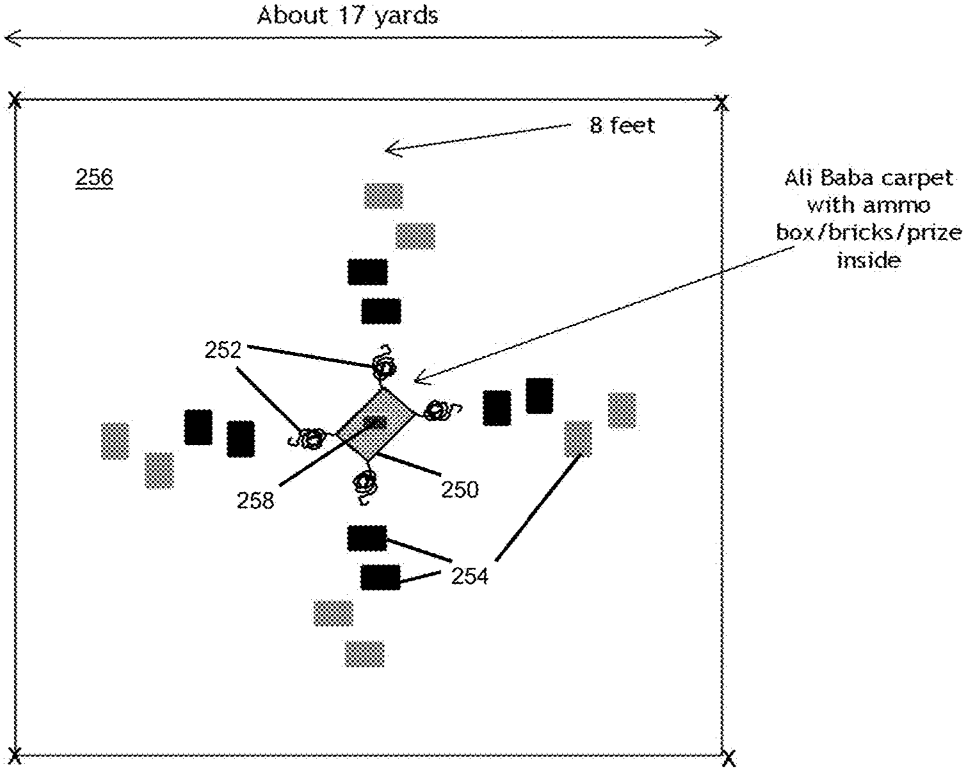
FIG. 3 is a diagram illustrating a component of the invention.

Ali Baba is an Execution Component in which the aim is to simulate a situation in which a work team must coordinate with high synchrony during a critical mission that requires ongoing communication during important moments. A diagram appears in FIG. 3. This Execution Component can be scaled to work for a team of any size but for the exemplar in FIG. 3, we assume a work team of 26 people. The small carpet 250 in the figure measures 1.5 yards by 2.5 yards and is supported by four high-quality climbing ropes 252 joined in the center; each rope is coiled by one corner of the carpet. Surrounding where marked are 16 square plastic markers 254 affixed to the ground, each measuring 1 foot by 1 foot. The whole setup is centered within a 17 yard by 17 yard area of "forbidden ground" 256. Attached on top of the carpet in the center is a small steel ammunition box 258 containing bricks to make the weight around 20 pounds and also some information the team needs to tackle the next Evolution.

Neither team members nor any equipment may touch the ground except on the plastic markers 254, the ammo box 258 cannot be dropped or dragged, and the total time allowed is 40 minutes including planning. Facilitators will help with practical tasks like knot tying but will not provide any solutions to the problem itself. The team is provided with 8 wooden planks and 20 ropes 252. BFDs 100 are used in this setup in Tilt mode to simulate the consequences of any mistakes in team strategy or execution.

A normal expectation is that the team will group in some constellation and with some chosen structure to strategize their roles, plan, timing and synchrony within the rules. When ready the exemplar design allows for up to 16 people to be standing on mats, using planks to gain entry, a further 8 waiting outside the forbidden ground to receive the ropes at 2 people per side, an overall Mission Director and a Safety Officer—totaling 26 people, With good planning, good coordination and excellent synchrony—the forces involved tend to cause failure with bad synchrony—the team will hopefully lift out the ammo box and then retrieve the information. It should be noted that the distances, weights, materials and overall design given above are the result of extensive calculation and experimentation over years to yield the optimal balance of difficulty and safety.

"Authenticator" is an example of an online Execution Component used in an Online Program.

Authenticator is an Execution Component in which the aim is to simulate a situation in which a work team must engage other teams with very little preparation in order to coordinate a response with high mutual dependencies in a narrow time frame. A diagram 401 appears in FIG. 4. Authenticator can be scaled for a team of any size but for this exemplar, we assume a work team of 18 people. As part of the setting up, the work team is divided into 3 sub-teams of 6 people each, according to a schema of people mixing that yields best results for the stated needs of the client. Each of the three teams then receives a set of 6 3-letter codes which are of no use to them, but of high use to both other teams. Each team has 20 minutes in which to find its own codes from other teams, send these codes by SMS text message to a central number within a fixed 10-minute window and receive a single-letter authentication in return, and then the balance of the total time to assemble these into an English password that unlocks a document.

A normal expectation is that each sub-team will reach out to make friends across other sub-teams, while managing the complexities carefully so as to avoid time loss and confusion. Since it is not initially clear which authentication codes 402 (see FIG. 4) are needed by any given team, high-speed and well-organized engagement is essential. The Text-sending portion requires high coordination across dependencies within teams, and the codeword-unlocking of the document at the end provides validation and celebration of success.

It should be noted that the codes, permutations and overall design given above are the result of extensive calculation and experimentation over years to yield the optimal balance of difficulty and engagement to get the needed team behaviors, and are considered part of the IP.

Exemplar Tool from a Discussion Component—The Four Steps Plus One

Figure 5:
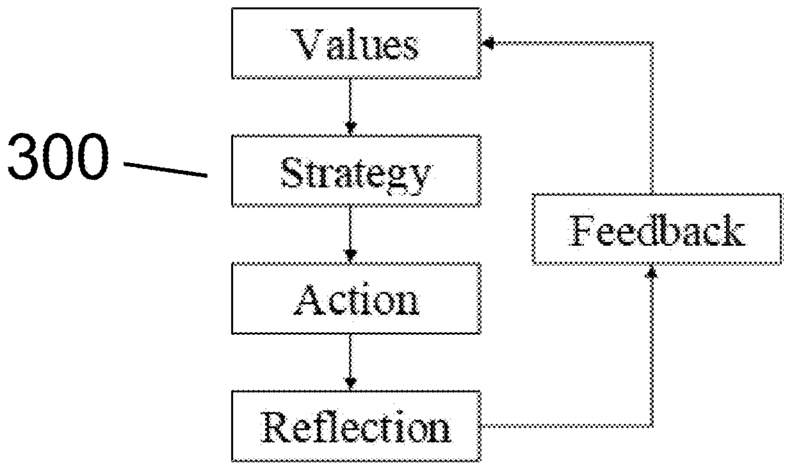
FIG. 5 is a diagram illustrating a tool used with the invention.

"The Four Steps Plus One" is a Tool from a Discussion Component which is intended to serve as a proven structural guideline for a team or corporate strategic plan. A diagram 300 appears in FIG. 5 and the explanation given to participants during the Discussion Component by a qualified facilitator is given below.

From the foregoing description, one skilled in the art can easily ascertain the essential characteristics of this invention and, without departing from the spirit and scope thereof, can make various changes and modifications of the invention to adapt it to various usages and conditions.

It is to be understood that the present invention is not limited to the sole embodiment described above, but encompasses any and all embodiments within the scope of the following claims.

The invention claimed is:

1. An apparatus for improving an outcome of a simulated task within a training program involving a plurality of individuals performing one or more execution components, each of said execution components involving one or more objects, each of said objects characterized by one or more attributes including a boundary or a size or an initial position or orientation, the apparatus comprising:

a portable programmable switching device having a water-resistant housing with at least four input terminals and at least four output terminals, said device having circuitry including a microprocessor, one or more sensing modules, and a transmitter/receiver module;

wherein the at least four input terminals are configured to receive respective input signals corresponding to four different switched input conditions, and wherein the at least four output terminals are configured to provide respective switched or voltage output conditions such that the switching device is configured to provide sixteen different machine states at a given time and to remember previous machine states;

wherein each of the at least four output terminals is configured to selectively provide a voltage output corresponding to one of: (i) a voltage input, or (ii) a switched output;

said switching device programmed to receive and interpret analog or digital signals generated by one or more sensors positioned to sense when the boundary of one of said objects is crossed or when the initial position, size, or orientation of one of said objects is altered;

said switching device programmed to poll, upon startup of an execution component, at least one of the one or more sensors to determine an operational status of the at least one sensor before the simulated task is performed;

said switching device programmed to transmit a signal to one or more output devices in response to interpreting the analog or digital signals generated by one or more sensors;

said switching device programmed to operate in one of at least two operational modes, wherein the at least two operational modes comprise:

a remote operating mode where an output device emits an alert in response to the transmitted signal generated from a facilitator-initiated radio signal received by the transmitter/receiver module while the plurality of individuals perform the execution component, and a tilt mode where an output device emits an alert in response to a change in orientation of said switching device detected after an initial calibration period by scanning an accelerometer angle in 3.5-degree increments, storing a first scanned accelerometer angle as an initial angle, scanning a second accelerometer angle, and setting a voltage output high for 10 seconds when the second accelerometer angle differs from the initial angle;

wherein each of said alerts is recorded on said switching device in real time to generate a list of alerts for each simulation;

wherein said operational mode of said switching device is determined based on said execution component and is switchable by a radio transmitter fob;

wherein said change in orientation of said switching device is detected by said one or more sensing modules.

2. The apparatus of claim 1 wherein said input terminals receive digital signals from said sensors.

3. The apparatus of claim 1 wherein said output terminals transmit digital signals wirelessly to said output devices.

4. The apparatus of claim 1 wherein said housing is transparent and water resistant, wherein one or more LEDs are positioned within the housing and visible to an operator through the transparent housing, and wherein circuitry of the switching device is visible through the transparent housing for assessing physical problems with the switching device.

5. A method of enhancing the accuracy of a simulation event, said simulation event a component of a training program involving a plurality of individuals performing one or more simulations, each of said simulations involving one or more objects having at least one alterable physical parameter, the method comprising:

programming one or more switching devices to directly or remotely sense alteration of said at least one physical parameter and generate an alert signal in response to said sensed alteration, each switching device having at least four inputs, at least four outputs, a microprocessor, one or more sensing modules including an accelerometer, and a transmitter/receiver module;

configuring the at least four inputs to receive respective input signals corresponding to four different switched input conditions and configuring the at least four outputs to provide respective switched or voltage output conditions such that each switching device provides sixteen different machine states at a given time and remembers previous machine states;

polling, by the microprocessor upon startup of the simulation event, one or more sensors to determine an operational status of the one or more sensors before the simulation event is performed;

whereby alteration of said physical parameter causes the alert signal to output from either said switching device or a remote alerting device;

wherein said at least one switching device is configured to operate in one of at least two operational modes, wherein the at least two operational modes comprise:

a remote operating mode where an output device emits an alert in response to a transmitted signal generated from a facilitator-initiated radio signal received by the transmitter/receiver module while the plurality of individuals perform the simulation, and a tilt mode where an output device emits an alert in response to a change in orientation of said switching device detected after an initial calibration period by scanning an accelerometer angle in 3.5-degree increments, storing a first scanned accelerometer angle as an initial angle, scanning a second accelerometer angle, and setting a voltage output high for 10 seconds when the second accelerometer angle differs from the initial angle;

wherein each alert is recorded by the microprocessor in real time to generate a list of alerts for each simulation; and wherein said operational mode of said switching device is determined based on said simulation and is switchable by a radio transmitter fob.

6. The method of claim 5 wherein said switching devices each include four output terminals, wherein each of the four output terminals is configured to selectively provide a voltage output corresponding to one of: (i) a voltage input, or (ii) a switched output.

7. The method of claim 5 wherein said switching devices produce an audible or visible alert.

8. The method of claim 6 wherein said inputs receive digital signals.

9. The method of claim 6 wherein said outputs transmit digital signals wirelessly to said output device.

10. The method of claim 5 wherein said simulation has several alterable physical parameters, and said at least one switching device receives triggering signals from sensors positioned to sense alteration of one or more of said alterable physical parameters.

11. The method of claim 10 wherein said triggering signals are received wirelessly.

12. The method of claim 5 wherein said switching device includes a microprocessor.

13. The method of claim 12 wherein said microprocessor records said alerts in real time.

14. The method of claim 5 wherein said switching device includes an accelerometer.

15. The method of claim 5 wherein said switching device includes a gyroscope.

16. The method of claim 10 wherein one of said sensors is a pressure mat that is polled by the microprocessor upon startup to determine operational status before the simulation is performed.

* * * * *